United States Patent
Takabayashi et al.

(10) Patent No.: US 6,518,593 B2
(45) Date of Patent: Feb. 11, 2003

(54) INTEGRATED CIRCUIT AND METHOD OF DESIGNING INTEGRATED CIRCUIT

(75) Inventors: Tsutomu Takabayashi, Tokyo (JP); Shizuo Morizane, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/774,676

(22) Filed: Feb. 1, 2001

(65) Prior Publication Data

US 2002/0031850 A1 Mar. 14, 2002

(30) Foreign Application Priority Data

Sep. 11, 2000 (JP) .......................... 2000-275515

(51) Int. Cl.[7] .................... H01L 23/58; G06F 17/50
(52) U.S. Cl. ............................. 257/48; 716/6
(58) Field of Search ................. 438/5, 6, 128, 438/129, 130, 131, 132; 257/48, 529; 716/4, 5, 6

(56) References Cited

U.S. PATENT DOCUMENTS 5,297,085 A  * 3/1994  Choi et al. .................. 365/200
5,576,987 A  * 11/1996 Ihara et al. .................. 365/149

FOREIGN PATENT DOCUMENTS

| JP | 10-283796   | 10/1998 |
| JP | 11-74465    | 3/1999  |
| JP | 11-166958   | 6/1999  |
| JP | 2000-114384 | 4/2000  |

* cited by examiner

Primary Examiner—Michael Sherry
Assistant Examiner—Evan Pert
(74) Attorney, Agent, or Firm—Leydig, Voit & Mayer, Ltd.

(57) ABSTRACT

An integrated circuit has a functional circuit for achieving an actual operation function of the integrated circuit, and a redundant circuit for replacing a defective circuit within the functional circuit. This integrated circuit has I/O regions for signal transmission between the functional circuit and outside of the functional circuit. Each I/O region incorporates fuse boxes for switching from a defective circuit to the redundant circuit.

4 Claims, 8 Drawing Sheets

INTEGRATED CIRCUIT AND METHOD OF DESIGNING INTEGRATED CIRCUIT

FIELD OF THE INVENTION

The present invention relates to an integrated circuit equipped with a redundant circuit, which redundant circuit is used in case there is any defective circuit. This invention also relates to a method of designing such an integrated circuit.

BACKGROUND OF THE INVENTION

In recent years, along with the progress of high-level information technology, there has been a high demand for higher-speed and multifunctional semiconductor integrated circuits. At the same time, based on the distribution of mobile machines, a reduction in chip sizes of the semiconductor integrated circuits has also been demanded. Therefore, the semiconductor integrated circuits have continuously been provided in finer and higher-density structures. As the semiconductor integrated circuits become finer and in higher density, the process of manufacturing the semiconductor integrated circuits becomes more difficult, and the probabilities of the occurrence of defective products become higher. As conventional semiconductor integrated circuits that restrict the reduction in productivity due to the occurrence of defects, those semiconductor integrated circuits having spare redundant circuits for relieving defective circuits have been known.

FIG. 10 shows a schematic configuration of a conventional semiconductor integrated circuit. This semiconductor integrated circuit includes a core region 11 positioned at the center of the semiconductor integrated circuit, and an I/O region 12 positioned at the periphery of the semiconductor integrated circuit. Within the core region 11, there are disposed a functional circuit that achieves an actual operation function of the semiconductor integrated circuit, a redundant circuit that is used to replace a defective circuit within the functional circuit, a fuse box including fuses replacing the defective circuit with the redundant circuit, and a test circuit that carries out a test for detecting a defective circuit. An input buffer circuit and an output buffer circuit are disposed within the I/O region 12. The wiring between a cell, 14-1 and a cell 14-2 that constitute the functional circuit, for example, makes a detour around a fuse box 13 if the fuse box 13 is positioned on a shortest route between the two cells 14-1 and 14-2.

FIG. 11 is a flowchart showing a sequence of a method of designing a conventional semiconductor integrated circuit. FIG. 12 and FIG. 13 are for explaining the method of designing the conventional semiconductor integrated circuit. According to this method of designing the conventional semiconductor integrated circuit, at first, a user, who requests a maker for the manufacture of a semiconductor integrated circuit, designs a functional circuit 17 (step S11). Next, the maker carries out a timing verification of a case of disposing the functional circuit 17 between an input buffer circuit 15a and an output buffer circuit 16a (refer to FIG. 12) (step S12). The maker decides whether the timing is suitable or not (step S13).

When the maker decides that the timing is not suitable, the process is returned to step S11, that is, the user once more designs the functional circuit 17. On the other hand, when the maker decides that the timing is suitable, the maker, as the manufacturer of this semiconductor integrated circuit, designs a test circuit 18 (step S14). The maker then inserts a standard cell selector 19a into between the functional circuit 17 and the input buffer circuit 15a, and inserts a standard cell selector 20a into between the functional circuit 17 and the output buffer circuit 16a. Further, the maker provides the test circuit 18 between the standard cell selectors 19a and 20a in parallel with the functional circuit 17 (refer to FIG. 13).

Next, the maker verifies the timing of the test circuit 18 (step S15), and makes a decision as to whether the timing is suitable or not (S16). When the maker decides that the timing is not suitable, the process returns to step S14, that is, the maker once more designs the test circuit 18. On the other hand, when the maker decides that the timing is suitable, the maker verifies the timing of the functional circuit 17 in the state that the standard cell selectors 19a and 20a are inserted (step S17). Then, the maker decides whether the timing is suitable or not (step S18).

The reason why the maker verifies the timing of the functional circuit 17 again is as follows. Sometimes the functional circuit 17 does not operate normally because of a delay generated due to the insertion of the standard cell selectors 19a and 20a. When it is decided at step S18 that the timing is suitable, the maker finishes the design processing. On the other hand, when it is decided at step S18 that the timing is not suitable, the user redesigns the functional circuit (step S19), and the process returns to step S17.

For simplification of the explanation, only one input buffer circuit and one output buffer circuit are shown in FIG. 12 and FIG. 13. However, in reality, there are many input and output buffer circuits in the semiconductor circuit, and these input and output buffer circuits are connected to the functional circuit 17 and the test circuit 18 respectively. After the design of the semiconductor integrated circuit has been finished, the maker starts the manufacturing and shipment of the semiconductor integrated circuit. A test processing of the semiconductor integrated circuit carried out by the maker prior to the shipment of the semiconductor integrated circuit will be explained next. In the test processing of the semiconductor integrated circuit, an external testing apparatus not shown transmits a control signal for selecting the test circuit 18 side to the standard cell selectors 19a and 20a. Thus, the standard cell selectors 19a and 20a select the test circuit 18 side.

The external testing apparatus (not shown) transmits test data to the test circuit 18 through the input buffer circuit 15a and the standard cell selector 19a. The test circuit 18 receives this test data, and tests the functional circuit 17. Then, the test circuit 18 outputs a result of the test through the standard cell selector 20a and the output buffer circuit 16a. When a test result showing that there is a defective circuit in the functional circuit 17 has been output, the maker disconnects a fuse within the fuse box, and switches from the defective circuit to a redundant circuit, thereby replacing the defective circuit.

According to the above-described conventional technique, however, the fuse box 13 is disposed within the core region 11, and the fuse box 13 hinders the wiring within the core region 11. Therefore, there has been a problem that the efficiency of wiring within the core region 11 is lowered. Furthermore, after the user has designed the functional circuit 17, the maker verifies the timing, and then inserts the standard cell selectors 19a and 20a. Then, the maker verifies the timing of the functional circuit 17 again. When the timing is not suitable, the user designs the functional circuit 17 again. Therefore, there has been a problem that the efficiency of the design processing is lowered and that the cost increases.

SUMMARY OF THE INVENTION

It is one object of the present invention to provide an integrated circuit that improves the efficiency of the disposition and wiring within the core region, and a method of designing this integrated circuit. Further, it is an another object of the invention to provide an integrated circuit that lowers the cost of the integrated circuit by improving the efficiency of the design processing, and a method of designing this integrated circuit.

According to one aspect of the present invention, the integrated circuit comprises a functional circuit, a redundant circuit, and at least one input/output processing unit that carries out a signal transmission between the functional circuit and the outside. This input/output processing unit(s) incorporates a changeover unit which changes over from the defective circuit to the redundant circuit. Thus, the changeover unit is incorporated into the input/output processing unit(s). Accordingly, it is not necessary to dispose the changeover unit in the core region of the integrated circuit.

Further, according to another aspect of the present invention, the integrated circuit comprises a functional circuit, a redundant circuit, and a test circuit that carries out a test of detecting the defective circuit, at least one input buffer circuit, and at least one output buffer circuit. The functional circuit is provided between one of the output terminals of the input buffer circuit and one of the input terminals of the output buffer circuit, and the test circuit is provided between the other output terminal of the input buffer circuit and the other input terminal of the output buffer circuit. The input buffer circuit(s) inputs a signal from the outside, and outputs a signal from the two output terminals. The output buffer circuit(s) inputs a signal to a selective one of the two input terminals, and outputs a signal to the outside. Accordingly, it is not necessary to insert a selector between the input buffer circuit and the functional circuit and between the output buffer circuit and the functional circuit respectively.

Further, according to still another aspect of the present invention, the integrated circuit comprises a functional circuit, a redundant circuit, a test circuit, a plurality of bi-directional buffer circuits, and an output buffer circuit. The functional circuit is provided between one of the output terminals of the input buffer circuit of one bi-directional buffer circuit and one of the input terminals of the output buffer circuit of the other bi-directional buffer circuit, and the test circuit is provided between the other output terminal of the input buffer circuit of the one bi-directional buffer circuit and the other input terminal of the output buffer circuit of the other bi-directional buffer circuit. Accordingly, it is not necessary to insert a selector between each bi-directional buffer circuit and the functional circuit.

Other objects and features of this invention will become apparent from the following description with reference to the accompanying drawings.

DESCRIPTION OF THE PREFERRED EMBODIMENTS

Preferred embodiments of the present invention will be explained in detail below with reference to the drawings. It is to be noted that these embodiments do not limit the present invention.

Figure 1:
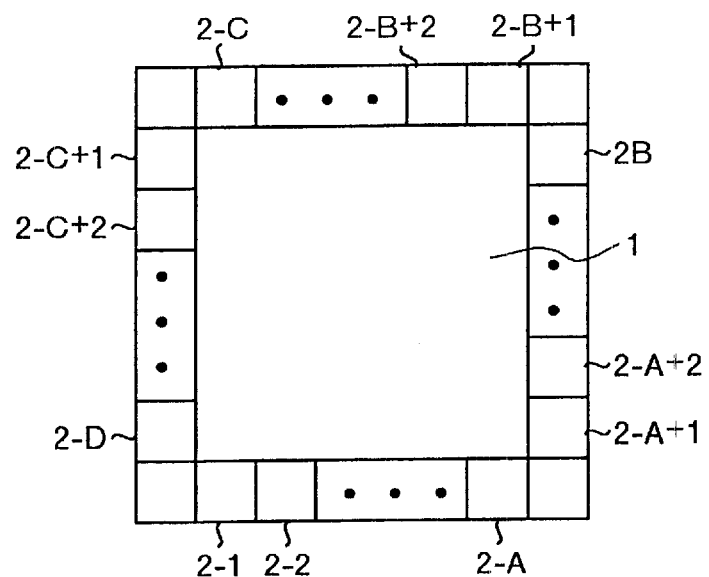
FIG. 1 is a diagram showing a schematic configuration of a semiconductor integrated circuit relating to a first embodiment of the present invention.

FIG. 1 is a diagram showing a schematic configuration of a semiconductor integrated circuit relating to a first embodiment of the present invention. This semiconductor integrated circuit has a spare redundant line (a redundant circuit) for relieving memory cells and memory cells. This semiconductor integrated circuit includes a core region 1 that is positioned at the center of the semiconductor integrated circuit, and I/O regions 2-1 to 2-D that are positioned at the periphery of the semiconductor integrated circuit. Within the core region 1, there are disposed a functional circuit (not shown) that achieves an actual operation function of the semiconductor integrated circuit, a redundant circuit (not shown) that is used based on a changeover from a defective circuit within the functional circuit, and a test circuit that carries out a test of detecting the defective circuit.

An input buffer circuit or an output buffer circuit, and fuse boxes (not shown) for changing over from a defective circuit to the redundant circuit are disposed within each of the I/O regions 2-1 to 2-D. In other words, fuse boxes are incorporated in each input buffer circuit and each output buffer circuit. Each fuse box determines a use/non-use state of the redundant circuit, and an address of the redundant circuit.

Figure 2:
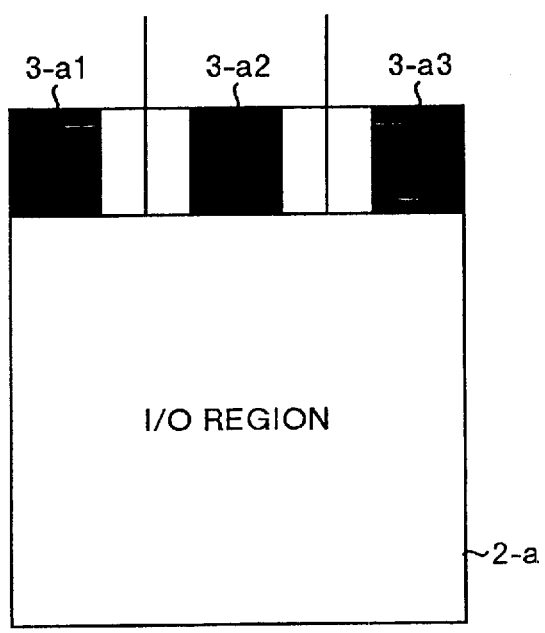
FIG. 2 is a diagram showing a schematic configuration of an I/O region shown in FIG. 1.

FIG. 2 is a diagram showing a schematic configuration of the I/O region shown in FIG. 1. An optional I/O region 2-a among the I/O regions 2-1 to 2-D has a structure that fuse boxes 3-a1 to 3-a3 are inserted into the normal I/O region having an input buffer circuit or an output buffer circuit (not shown) disposed therein. A predetermined interval is secured between the fuse boxes 3-a1 to 3-a3. Through each of these gaps, a signal transmission is carried out between the input buffer circuit or the output buffer circuit within the I/O region 2-a and a circuit within the core region 1.

In general, the wiring within each I/O region is relatively simple, and the fuse boxes 3-a1 to 3-a3 can be inserted into the I/O region relatively easily. The structures of the fuse boxes inserted into each of the I/O regions 2-1 to 2-D are common. This facilitates a fuse disconnection work. As the fuse boxes are incorporated into each input buffer circuit and each output buffer circuit, it is not necessary to reduce the numbers of the input buffer circuits and the output buffer circuits respectively from those numbers required conventionally.

Figure 3:
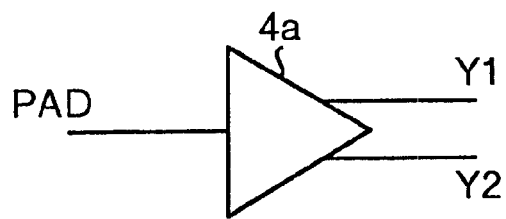
FIG. 3 is a diagram showing a schematic configuration of an input buffer circuit relating to the first embodiment.
Figure 4:
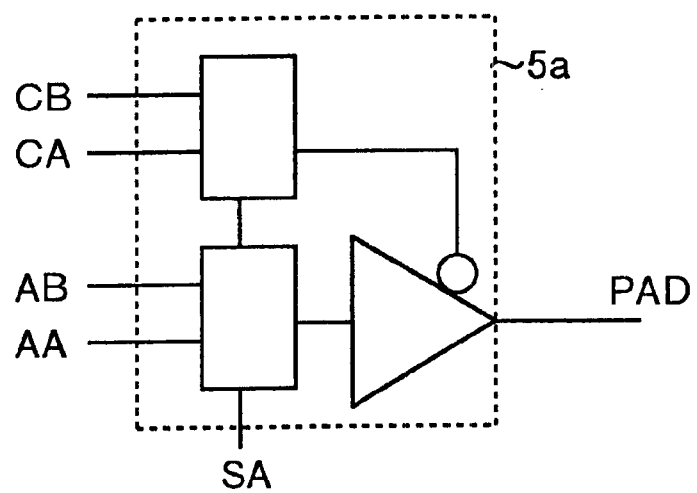
FIG. 4 is a diagram showing a schematic configuration of an output buffer circuit relating to the first embodiment.

FIG. 3 is a diagram showing a schematic configuration of the input buffer circuit disposed in the I/O region relating to the first embodiment. An input buffer circuit 4a relating to the first embodiment has two output terminals Y1 and Y2. The input buffer circuit 4a inputs a signal from the outside of the semiconductor integrated circuit through a pad, buffers this signal and outputs the buffered signal from the output terminals Y1 and Y2 to a circuit within the core region 1. FIG. 4 is a diagram showing a schematic configuration of the output buffer circuit relating to the first embodiment. An output buffer circuit 5a relating to the first embodiment incorporates a selector. The selector selects either input terminals AA and CA or input terminals AB and CB according to a control signal applied to a control terminal SA from the outside of the semiconductor integrated circuit, and inputs a signal from a circuit within the core region 1 to the selected input terminals. The output buffer circuit 5a then buffers this input signal, and outputs the buffered signal to the outside of the semiconductor integrated circuit through a pad.

Figure 5:
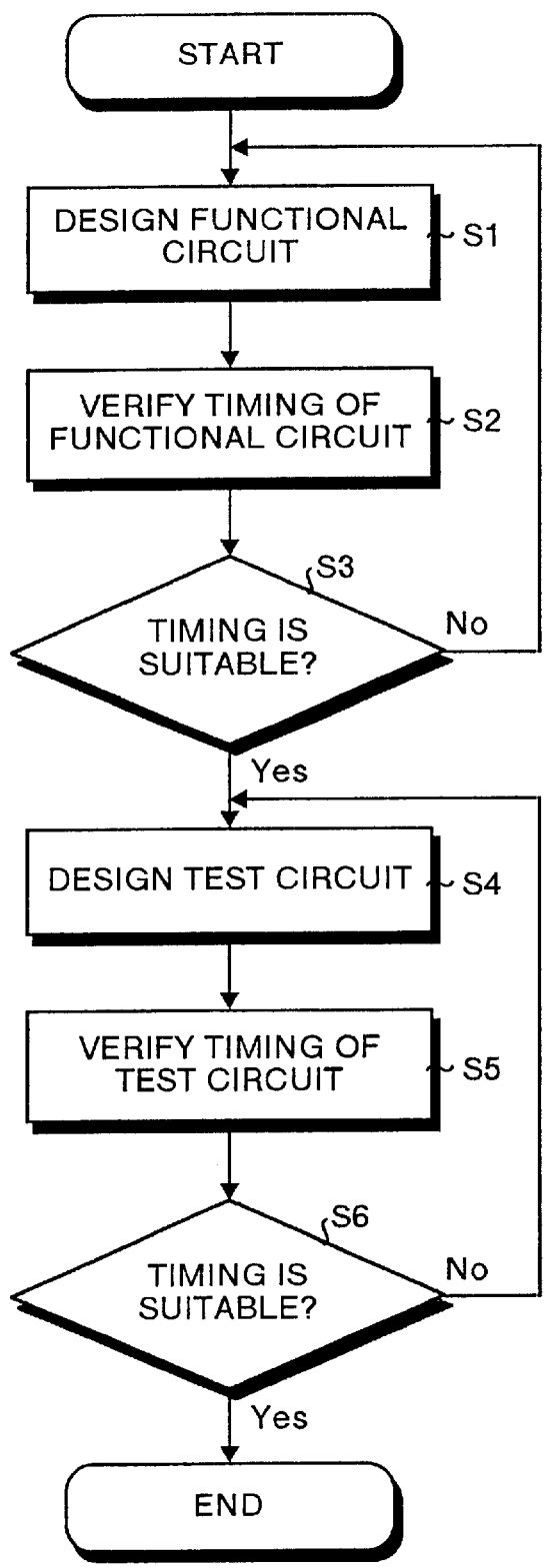
FIG. 5 is a flowchart showing a sequence of a method of designing a semiconductor integrated circuit relating to the first embodiment.
Figure 6:
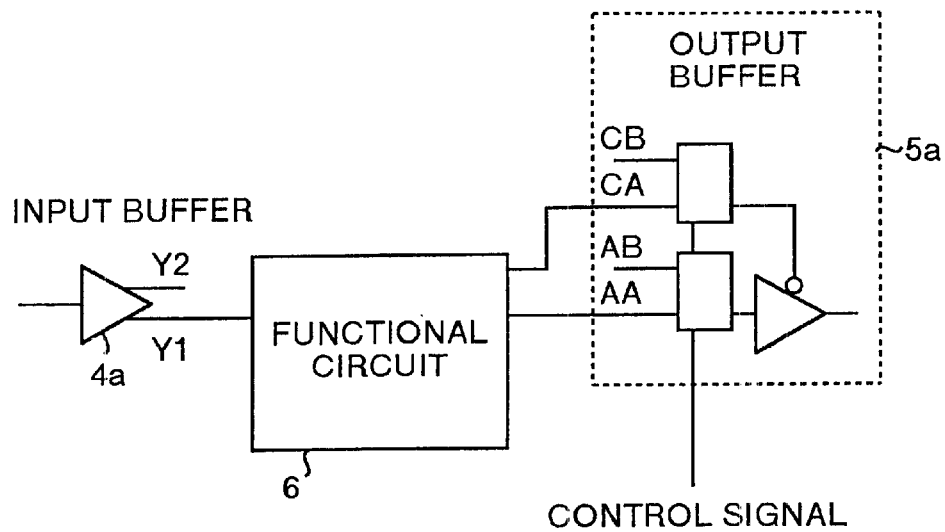
FIG. 6 is a diagram for explaining the method of designing a semiconductor integrated circuit relating to the first embodiment.
Figure 7:
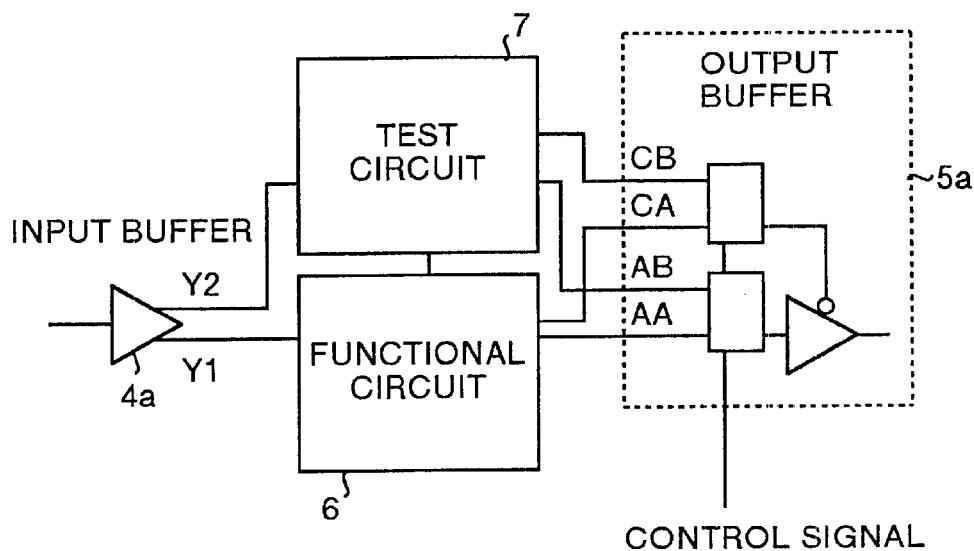
FIG. 7 is a diagram for explaining the method of designing a semiconductor integrated circuit relating to the first embodiment.

The operation of the semiconductor integrated circuit relating to the first embodiment having the above-described structure will be explained next with reference to FIG. 5 to FIG. 7. FIG. 5 is a flowchart showing a sequence of a method of designing a semiconductor integrated circuit relating to the first embodiment. FIG. 6 and FIG. 7 are diagrams for explaining the method of designing the semiconductor integrated circuit relating to the first embodiment respectively. The method of designing the semiconductor integrated circuit will be explained. At first, a user who requests a maker to manufacture a semiconductor integrated circuit designs a circuit having a functional circuit 6 disposed between one output terminal Y1 of a input buffer circuit 4a and one set of input terminals AA and CA of an output buffer circuit 5a (reference FIG. 6) (S1).

Next, the maker verifies the timing of the functional circuit 6 (S2), and makes a decision as to whether the timing is suitable or not (S3). In other words, the user designs the functional circuit 6 by handling the input buffer circuit 4a having the two outputs and the output buffer circuit 5a having the selector. The design is made in a similar manner to that of handling the conventional input buffer circuit 15a and output buffer circuit 16a as explained previously. Also, the maker carries out the timing verification. When the maker has made a decision that the timing is not suitable, the process returns to step S1. On the other hand, when a decision has been made that the timing is suitable, the maker, as the manufacturer of the semiconductor integrated circuit, designs a test circuit 7 (S4). Then, the maker inserts the test circuit 7 into between the other output terminal Y2 of the input buffer circuit 4a and the other set of input terminals AB and CB of the output buffer circuit 5a (reference FIG. 7).

Next, the maker verifies the timing of the test circuit 7 (S5), and makes a decision as to whether the timing is suitable or not (S6). When a decision has been made that the timing is not suitable, the process returns to step S4. On the other hand, when a decision has been made that the timing is suitable, the design processing is finished. According to this design processing, as the input buffer circuit 4a having the two outputs and the output buffer circuit 5a having the selector are used, it is possible to insert the test circuit 7 without shifting the timing of the functional circuit 6.

While only one input buffer circuit and one output buffer circuit are shown in FIG. 6 and FIG. 7 to simplify the explanation, a plurality of input buffer circuits and a plurality of output buffer circuits are provided in actual practice. The plurality of circuits are connected to the functional circuit 6 and the test circuit 7 respectively. After the design of the semiconductor integrated circuit has been finished, the maker starts the manufacturing and shipment of the semiconductor integrated circuit. A test processing of the semiconductor integrated circuit carried out by the maker prior to the shipment of the semiconductor integrated circuit will be explained next. In the test processing of the semiconductor integrated circuit, an external testing apparatus not shown transmits a control signal (a low-level signal) for selecting the test circuit 7 side (the input terminals AA and CA) to the output buffer circuit 5a. Thus, the output buffer circuit 5a selects the test circuit 7.

Next, the external testing apparatus not shown transmits test data to the test circuit 7 through the input buffer circuit 4a. The test circuit 7 receives this test data, and tests the functional circuit 6. Then, the test circuit 7 outputs a result of the test to the outside through the output buffer circuit 5a. When a test result that shows that there is a defective circuit in the functional circuit 6, the maker disconnects a predetermined fuse within the fuse box, and switches the defective circuit to a redundant circuit, thereby to relieve the defective circuit. During a normal operation, the control terminal SA of the output buffer circuit 5a becomes at a low level, and the output buffer circuit 5a selects the functional circuit side (the input terminals AA and CA).

As explained above, according to the first embodiment, the input buffer circuit or the output buffer circuit and the fuse boxes 3-a1 to 3-a3 are provided in the same I/O region 2-a. In other words, each input buffer circuit and each output buffer circuit incorporates the fuse boxes respectively. Based on this arrangement, it is not necessary to dispose the fuse boxes within the core region 1. Therefore, it is possible to improve the efficiency of the disposition and wiring within the core region 1. Further, as the structures of the fuse boxes are made common, it is possible to improve the work efficiency of the fuse disconnection.

Further, according to the first embodiment, the input buffer circuit 4a inputs a signal from the outside, and the two output terminals Y1 and Y2 output a signal respectively. The output buffer circuit 5a inputs a signal to a selective one of the two input terminals AA and AB, and outputs a signal to the outside. The functional circuit 6 is provided between one output terminal of the input buffer circuit 4a and one set of input terminals of the output buffer circuit 5a. The test circuit 7 is provided between the other output terminal of the input buffer circuit 4a and the other set of input terminals of the output buffer circuit 5a. Therefore, based on the above arrangement, it is not necessary to insert a selector into between the input buffer circuit 4a or the output buffer circuit 5a and the functional circuit 6. As a result, it is possible to lower the cost by improving the efficiency of the design processing. Furthermore, as it is possible to eliminate the standard cell selector at the input side, the number of gates can be decreased as compared with the conventional structure.

Figure 8:
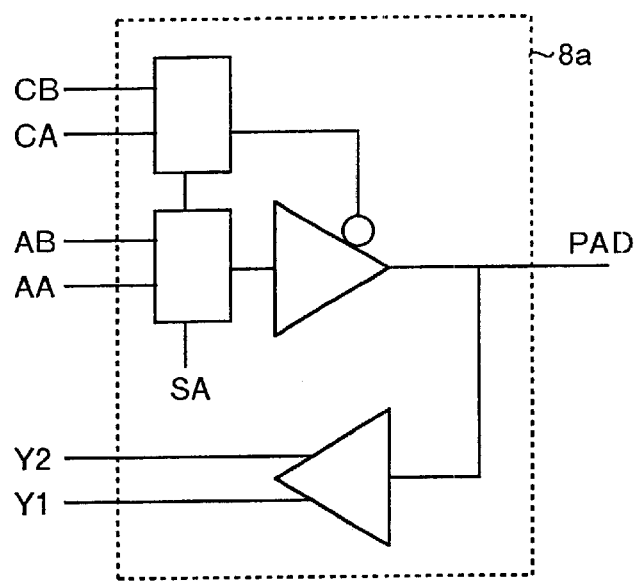
FIG. 8 is a configuration diagram showing a bi-directional buffer circuit relating to a second embodiment of the present invention.

A second embodiment of the present invention will be explained below. In this second embodiment, a bi-directional buffer circuit is provided instead of the input buffer circuit or the output buffer circuit in the first embodiment. FIG. 8 is a diagram showing a schematic configuration of a bi-directional buffer circuit relating to the second embodiment of the present invention. A bi-directional buffer circuit 8a in the second embodiment is a combination of the input buffer circuit 4a and the output buffer circuit 5a of the first embodiment. In other words, the bi-directional buffer circuit 8a has such a structure that the input terminals of the input buffer circuit 4a and the output terminals of the output buffer circuit 5a are connected to the same pad. Other structures of this semiconductor integrated circuit are the same as those of the above first embodiment.

Figure 9:
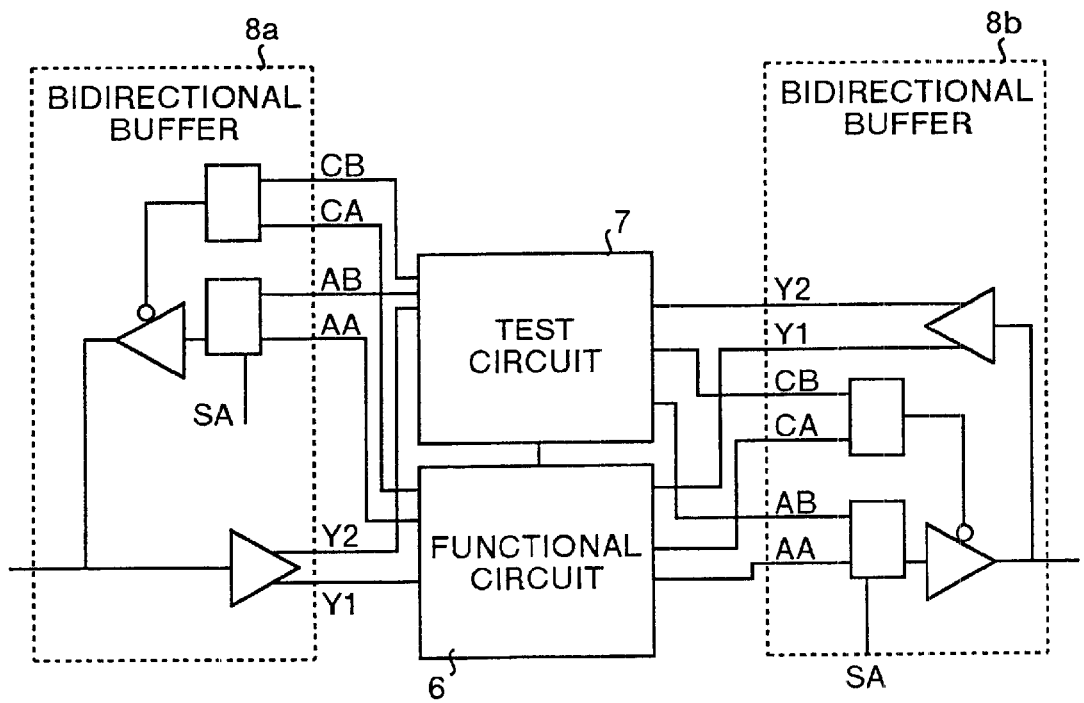
FIG. 9 is a diagram for explaining a method of designing a semiconductor integrated circuit relating to the second embodiment of the present invention.
Figure 10:
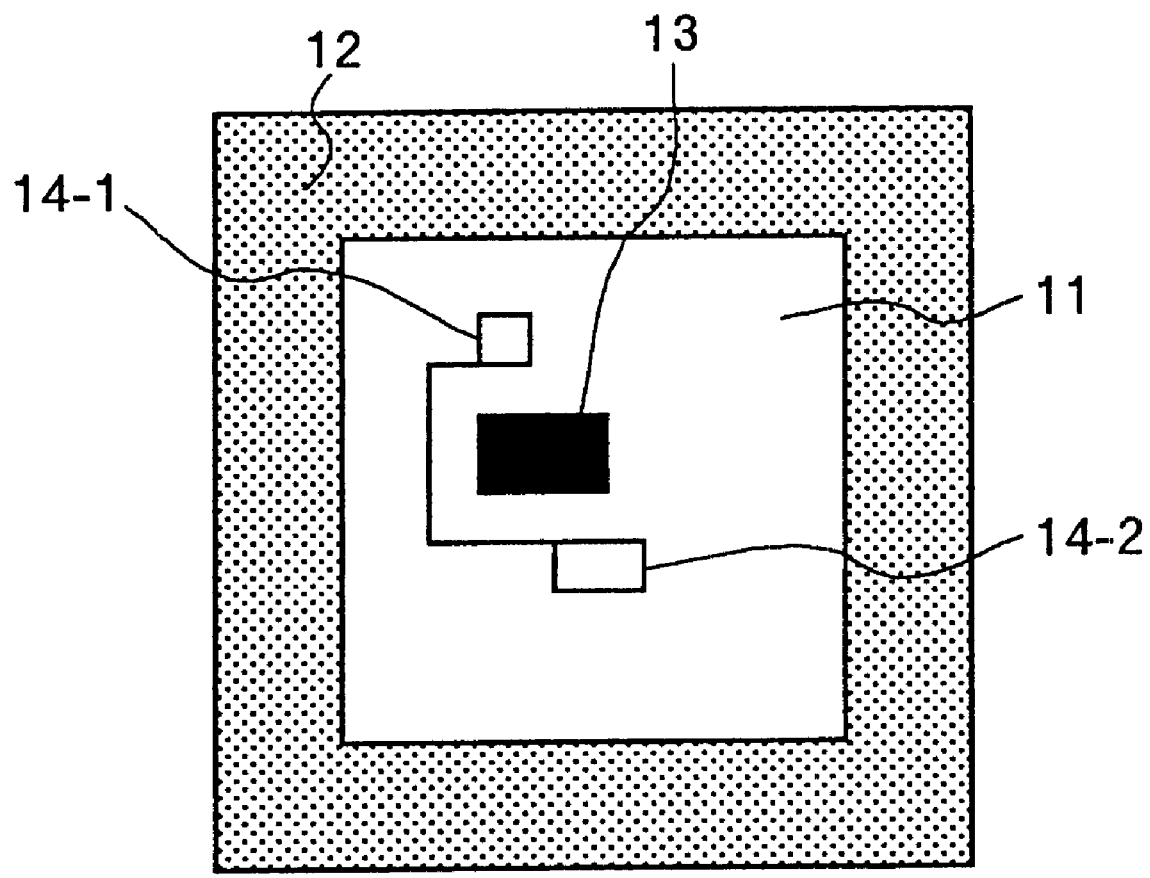
FIG. 10 is a diagram showing a schematic configuration of a conventional semiconductor integrated circuit.
Figure 11:
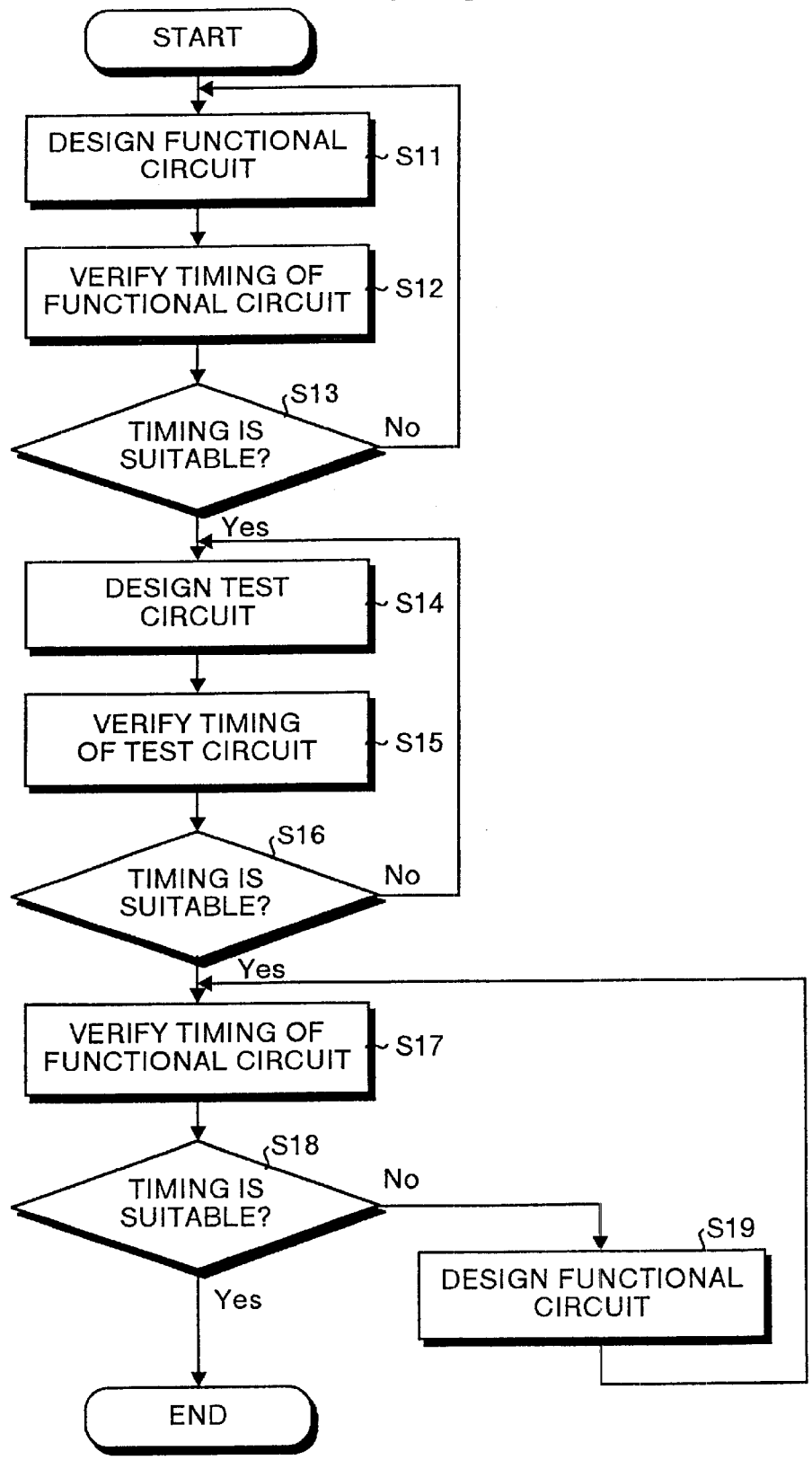
FIG. 11 is a flowchart showing a sequence of a method of designing the conventional semiconductor integrated circuit.
Figure 12:
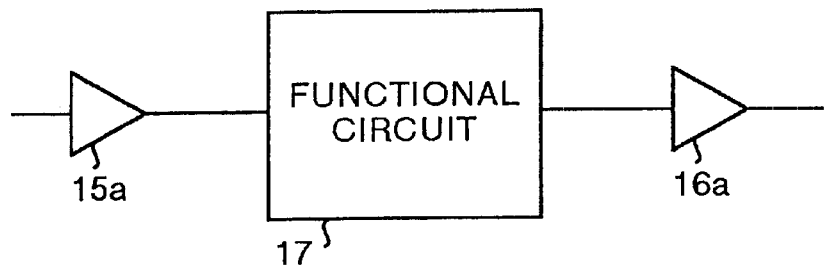
FIG. 12 is a diagram for explaining the method of designing the conventional semiconductor integrated circuit.
Figure 13:
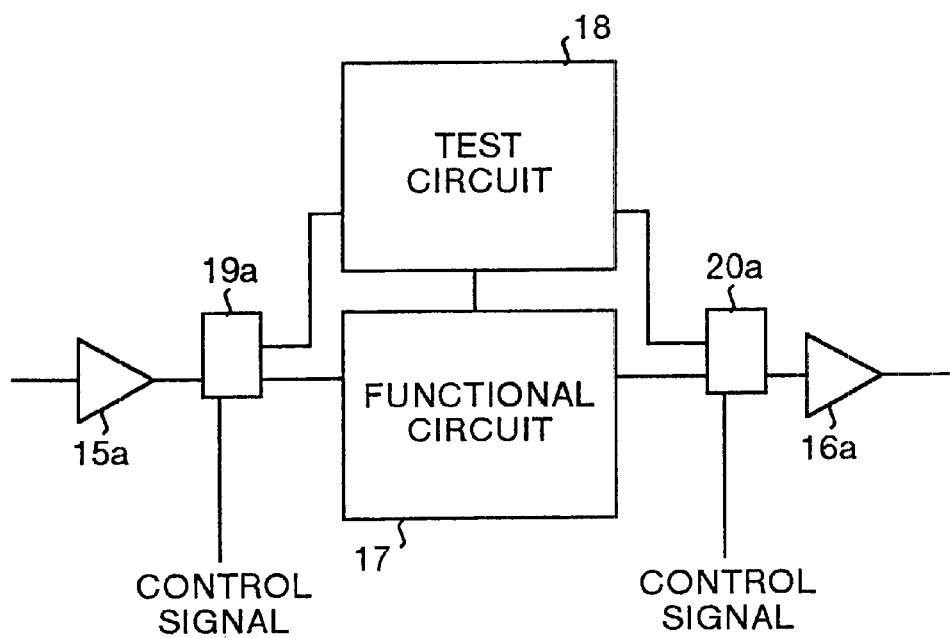
FIG. 13 is a diagram for explaining the method of designing the conventional semiconductor integrated circuit.

The operation of the semiconductor integrated circuit relating to the second embodiment having the above-described structure will be explained next with reference to FIG. 9. FIG. 9 is a diagram for explaining the method of designing the semiconductor integrated circuit relating to the second embodiment. The semiconductor integrated circuit relating to the second embodiment is designed in a similar manner to that of the first embodiment, except the following. A functional circuit 6 is provided between an output terminal Y1 and input terminals AA and CA of the bi-directional buffer circuit 8a and an output terminal Y1 and input terminals AA and CA of other bi-directional buffer circuit 8b. Also, the test circuit 7 is provided between an output terminal Y2 and input terminals AB and CB of the bi-directional buffer circuit 8a and an output terminal Y2 and input terminals AB and CB of other bi-directional buffer circuit 8b.

While only two bi-directional buffer circuits are shown in FIG. 9 to simplify the explanation, a large number of bi-directional buffer circuits are provided in actual practice. Those bi-directional buffer circuits are connected to the functional circuit 6 and the test circuit 7 respectively. Other operations are similar to those of the first embodiment. As explained above, according to the second embodiment, as the bi-directional buffers are used, it is possible to obtain an effect that the degree of freedom improves in the selection of kinds of test signals and test pin positions, in addition to the effects obtained in the first embodiment.

As explained above, according to the present invention, the input/output processing unit that carries out a signal transmission between the functional circuit and the outside incorporates the changeover unit for changing over from the defective circuit to the redundant circuit. Based on this arrangement, it is not necessary to dispose the changeover means in the core region of the integrated circuit. As a result, there is an effect that it is possible to improve the efficiency of the disposition and wiring within the core region.

Further, according to the present invention, at least one input buffer circuit inputs a signal from the outside, and outputs a signal from the two output terminals. At least one output buffer circuit inputs a signal to a selective one of the two input terminals, and outputs a signal to the outside. Further, the functional circuit is provided between one of the output terminals of the input buffer circuit and one of the input terminals of the output buffer circuit. The test circuit is provided between the other output terminal of the input buffer circuit and the other input terminal of the output buffer circuit. Therefore, it is not necessary to insert a selector between the input buffer circuit and the functional circuit and between the output buffer circuit and the functional circuit respectively. As a result, there is an effect that it is possible to lower the cost by improving the efficiency of the design processing.

Further, according to the present invention, a plurality of bi-directional buffer circuits are provided. Each bi-directional buffer circuit includes an input buffer circuit that inputs a signal from the outside and outputs a signal from two output terminals, and an output buffer circuit that inputs a signal to a selective one of two input terminals and outputs a signal to the outside. The functional circuit is provided between one of the output terminals of the input buffer circuit of one bi-directional buffer circuit and one of the input terminals of the output buffer circuit of the other bi-directional buffer circuit. The test circuit is provided between the other output terminal of the input buffer circuit of the one bi-directional buffer circuit and the other input terminal of the output buffer circuit of the other bi-directional buffer circuit. Based on this arrangement, is not necessary to insert a selector into between each bi-directional buffer circuit and the functional circuit. As a result, there is an effect that it is possible to lower the cost by improving the efficiency of the design processing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An integrated circuit comprising:
   a functional circuit that achieves an actual operation function of the integrated circuit;
   a redundant circuit for replacing a defective circuit within the functional circuit;
   a test circuit that carries out a test for detecting a defective circuit;
   at least one input buffer circuit, each input buffer circuit having two output terminals, that receives a signal from outside the input buffer circuit, and outputs a signal from said two output terminals; and
   at least one output buffer circuit, each output buffer circuit having two input terminals, that selectively receives a signal from any one of said two input terminals and outputs a signal outside the output buffer circuit, wherein
      said functional circuit is provided between one of said two output terminals of said input buffer circuit and one input terminal of said two input terminals of said output buffer circuit, and
      said test circuit is provided between the other output terminal of said two output terminals of said input buffer circuit and the other input terminal of said two input terminals of said output buffer circuit.

2. An integrated circuit comprising:
   a functional circuit that achieves an actual operation function of the integrated circuit;
   a redundant circuit for replacing a defective circuit within the functional circuit;
   a test circuit that carries out a test for detecting a defective circuit;
   a plurality of bi-directional buffer circuits, each bi-directional buffer circuit including an input buffer circuit and an output buffer circuit, each input buffer circuit having two output terminals and each output buffer circuit having two input terminals, said input buffer circuit receiving a signal from outside of said input buffer circuit, and outputting a signal from said two output terminals, and said output buffer circuit selectively receiving a signal from either one of said two input terminals and outputting a signal outside of said output buffer circuit, wherein
      said functional circuit is provided between one output terminal of said two output terminals of said input buffer circuit of one bi-directional buffer circuit and one input terminal of said two input terminals of said output buffer circuit of another bi-directional buffer circuit, and said test circuit is provided between the other output terminal of said two output terminals of said input buffer circuit of said one bi-directional buffer circuit and the other input terminal of said two input terminals of said output buffer circuit of said another bi-directional buffer circuit.

3. A method of designing an integrated circuit, said integrated circuit comprising a functional circuit that achieves an actual operation function of the integrated circuit, and a redundant circuit for replacement of a defective circuit within the functional circuit, and a test circuit that detects a defective circuit, the designing method comprising:

designing a circuit in which said functional circuit is disposed between one output terminal of an input buffer circuit that outputs a signal from two output terminals and one input terminal of an output buffer circuit that receives a signal at a selected one of two input terminals, and verifying timing of the functional circuit;

designing a circuit in which the test circuit is disposed between the other output terminal of said input buffer circuit and the other input terminal of said output buffer circuit; and verifying timing of said test circuit.

4. A method of designing an integrated circuit, said integrated circuit comprising a functional circuit that achieves an actual operation function of the integrated circuit, and a redundant circuit for replacement of a defective circuit within the functional circuit, and a test circuit that detects a defective circuit, the designing method comprising:

designing a plurality of bi-directional buffer circuits, each bi-directional buffer circuit including an input buffer circuit that outputs a signal from two output terminals and an output buffer circuit that receives a signal at a selected one of two input terminals, and a circuit having the functional circuit disposed between one output terminal of said input buffer circuit of one bi-directional buffer circuit and one input terminal of said output buffer circuit of another bi-directional buffer circuit;

verifying timing of said functional circuit;

designing a circuit in which said test circuit is disposed between said other output terminal of said input buffer circuit of said one bi-directional buffer circuit and said other input terminal of said output buffer circuit of said another bi-directional buffer circuit; and verifying timing of said test circuit.

* * * * *